United States Patent
Rozbicki

(10) Patent No.: US 6,440,854 B1
(45) Date of Patent: Aug. 27, 2002

(54) ANTI-AGGLOMERATION OF COPPER SEED LAYERS IN INTEGRATED CIRCUIT METALIZATION

(75) Inventor: Robert T. Rozbicki, San Jose, CA (US)

(73) Assignee: Novellus Systems, Inc., San Jose, CA (US)

(*) Notice: Subject to any disclaimer, the term of this patent is extended or adjusted under 35 U.S.C. 154(b) by 0 days.

(21) Appl. No.: 09/776,702

(22) Filed: Feb. 2, 2001

(51) Int. Cl.[7] .............................................. H01L 21/44
(52) U.S. Cl. .................. 438/687; 438/625; 438/628; 438/642; 438/644; 438/650; 438/654; 438/655; 438/658; 438/686; 438/687; 420/490; 420/497
(58) Field of Search ................................ 438/625, 628, 438/642, 644, 650, 654, 655, 658, 686, 687; 420/490, 497

(56) References Cited

U.S. PATENT DOCUMENTS 5,969,422 A * 10/1999 Ting et al. ................... 257/762
6,046,108 A *  4/2000 Liu et al. ..................... 438/687
6,077,780 A *  6/2000 Dubin ......................... 438/687

OTHER PUBLICATIONS

Sun et al., Suppression of Cobalt Silicide Agglomeration Using Nitrogen (N2+) Implantation, IEEE Electron Device Letters, vol. 19, No. 5, May 1998, pp. 163–166.

Ashtiani et al., "A New Hollow–Cathode Magnetron Source for 0.10μm Copper Applications", Journal of Vacuum Science and Technology, A 18(4) Jul./Aug. 2000 p. 1546.

Cohen et al., "Reactive Preclean Technology for Nonphysical Copper Oxide Reduction for Advanced CU Interconnect", Jun. 16–Jun. 18, 1998, VMIC Conference, pp. 91 and 93.

Jian Li and J. W. Mayer and E. G. Colgan, "Oxidation and Protection in Copper and Copper Alloy Thin Films", J. Appl. Physc. 70 (5), Sep. 1, 1991, pp. 2820–2827.

Ding et al., "Observation of Reduced Oxidation Rates for Plasma–Assisted CVD Copper Films", Mat. Res. Soc. Symp. Proc., vol., 309, 1993 pp.445–460.

Klawuhn et al., "Ionized Physical–vapor Deposition Using a Hollow–Cathode Magnetron Source for Advanced Metallization", J. Vac, Sci, Technol. A18(4), Jul./Aug. 2000, pp. 1546–1549.

M. Zinke–Allmang, "Phase Separation on Solid Surfaces: Nucleation, Coarsening and Coalescence Kinetics".

* cited by examiner

Primary Examiner—David L. Talbott
Assistant Examiner—David A. Zarneke
(74) Attorney, Agent, or Firm—Beyer Weaver & Thomas, LLP

(57) ABSTRACT

The present invention pertains to systems and methods for reducing the agglomeration of copper deposited by physical vapor deposition. More specifically, the invention pertains to systems and methods for depositing copper seed layers on a semiconductor wafer. The invention involves the use of an anti-agglomeration agent, so that the copper deposition is completed in an even, continuous and conformal manner.

10 Claims, 7 Drawing Sheets

ANTI-AGGLOMERATION OF COPPER SEED LAYERS IN INTEGRATED CIRCUIT METALIZATION

CROSS-REFERENCE TO RELATED APPLICATIONS

This patent application is related to U.S. patent application Ser. No. 09/776,704 "Passivation of Copper in Dual Damascene Metalization" filed by Rozbicki et al. on the same date as this application. This patent application, along with all other patent applications, patents and publication are herein incorporated by reference in their entirety for all purposes.

FIELD OF THE INVENTION

The present invention pertains to systems and methods for reducing the agglomeration of copper deposited by physical vapor deposition. More specifically, the invention pertains to systems and methods for depositing copper seed layers on a semiconductor wafer. The invention involves the use of an anti-agglomeration agent, so that the copper deposition is completed in an even, continuous and conformal manner.

BACKGROUND OF THE INVENTION

Integrated circuit (IC) manufacturers have traditionally used aluminum and aluminum alloys, among other metals, as the conductive metal for integrated circuits. While copper has a greater conductivity than aluminum, it has not been used because of certain challenges it presents, including the fact that it readily diffuses into silicon oxide and degrades insulating electrical properties at very low doping concentrations. Recently, however, IC manufacturers have been turning to copper because of its high conductivity and electromigration resistance, among other desirable properties. Most notable among the IC metalization processes that use copper is Damascene processing.

Damascene processing is a method for forming metal lines on integrated circuits. It involves formation of inlaid metal lines in trenches and vias formed in a dielectric layer (inter-metal dielectric). A barrier layer that blocks diffusion of copper atoms is typically formed over the dielectric layer and underneath the metalization. Damascene processing is often a preferred method because it requires fewer processing steps than other methods and offers a higher yield. It is also particularly well-suited to metals such as Cu that cannot readily be patterned by plasma etching.

In a typical copper IC process, the formation of the desired conductive wires on the chip generally begins with a seed layer, usually deposited by physical vapor deposition (PVD). The seed layer provides a conformal, conductive layer on which a thicker layer of copper is electrofilled in order to fill in the features (e.g., trenches and vias) of the semiconductor wafer. One of the most significant problems with PVD deposition of copper is that the copper tends to agglomerate at the surface. Because of this agglomeration, the copper does not cover the surface in a conformal manner. Coverage that is not conformal means coverage that is uneven; i.e., thicker in some places than others, and that may include actual gaps. Thus the seed layer does not provide a uniform layer for electroplating, which leads to defects in the electroplated copper.

What is needed therefore is an improved process in which copper seed layers are formed with reduced agglomeration.

SUMMARY OF THE INVENTION

The present invention pertains to systems and methods for reducing the agglomeration of copper deposited by physical vapor deposition. More specifically, the invention pertains to systems and methods for depositing the copper seed layer on a semiconductor wafer on the barrier layer. The deposition is carried out in a manner that reduces the kinetics of agglomeration (and sometimes the thermodynamic driving force for agglomeration), so that the deposition is completed in an even, conformal manner.

One aspect of the invention provides for a method for physical vapor deposition of copper to form part or all of a seed layer on an integrated circuit surface substrate. The method includes applying a nitrogen-containing agent to incorporate nitrogen into the seed layer to reduce agglomeration of the copper seed layer. The method may employ a hollow-cathode magnetron to deposit the copper. Regardless of the reactor chosen, the method employs a nitrogen-containing gas or plasma. A separate annealing operation may or may not be carried out on the copper seed layer. The nitrogen can be introduced during PVD deposition of the copper. Only a portion of the copper seed layer need contain nitrogen. No actual $Cu_3N$ compound need be formed. The method may be used in Damascene processing and dual Damascene processing. The nitrogen-containing agent may be $N_2$, $NH_3$, or $NH_4OH$.

Another aspect of the invention provides for a method for physical vapor deposition of copper to form part or all of a seed layer on an integrated circuit surface substrate. The method includes applying an anti-agglomeration agent to the agent into the seed layer to reduce agglomeration of the copper seed layer. The anti-agglomeration agent may reduce the mobility of the copper in the copper seed layer. The anti-agglomeration agent may contain a metallic element such as silicon or platinum. The method may employ a hollow-cathode magnetron to deposit the copper. Regardless of the reactor chosen, the method preferentially employs a gas or plasma to apply the anti-agglomeration agent. No separate annealing operation need be carried out on the copper seed layer. The anti-agglomeration agent can be introduced during PVD deposition of the copper. Only a portion of the copper seed layer need contain the anti-agglomeration agent. The method may be used in Damascene processing and dual Damascene processing. The anti-agglomeration agent may be a silicon or platinum containing gas.

Another aspect of the invention provides for an apparatus module for physical vapor deposition of copper seed layer on an integrated circuit substrate in a manner that reduces agglomeration of the copper seed layer, including a PVD chamber, a hollow-cathode magnetron, a copper target, a source of a neutral sputtering gas and a source of an anti-agglomeration agent. The anti-agglomeration agent may be a nitrogen, silicon or platinum containing agent. The anti-agglomeration agent source may be a gas or plasma. The apparatus is used to form part or all of a copper layer seed in a manner that reduces agglomeration of the copper. The apparatus may be used in Damascene or dual Damascene processing.

These and other features and advantages of the present invention will be described in more detail below with reference to the associated drawings.

DETAILED DESCRIPTION OF THE PREFERRED EMBODIMENTS

In the following detailed description of the present invention, numerous specific embodiments are set forth in order to provide a thorough understanding of the invention. However, as will be apparent to those skilled in the art, the present invention may be practiced without these specific details or by using alternate elements or processes. In other instances well-known processes, procedures and components have not been described in detail so as not to unnecessarily obscure aspects of the present invention.

A "semiconductor wafer" as referred to in this invention is a semiconductor substrate at any of the various states of manufacture in the production of integrated circuits. One standard semiconductor wafer described in this invention is 200 mm in diameter, 0.75 mm thick, with an approximate radius of curvature of about 0.15 millimeters (see SEMI Specification M1-0298). Of course, semiconductor wafers of other dimensions, such as a standard 300 mm diameter silicon wafers, can also be processed in accordance with this invention. Note that standard specifications for a 300 mm diameter wafer may be found in SEMI Specification M1.15-0997.

A "substrate surface" as referred to in this invention is any surface whereupon a seed layer is to be deposited. Substrate surfaces include, but are not limited to, semiconductor substrate surfaces in various states of manufacture, including surfaces on which the barrier layer has just been deposited.

The current invention is compatible with any sort of semiconductor manufacturing where a thin "seed" layer of copper must be deposited. This seed layer is typically deposited in preparation for deposition of a thicker electrofill layer. A particular semiconductor process that is compatible with the invention is Damascene processing, including dual Damascene processing, but the current invention is not limited to Damascene processing or semiconductor processing in general. The current invention is useful in many applications where a thin layer or layers of metal must be deposited.

Figure 1:
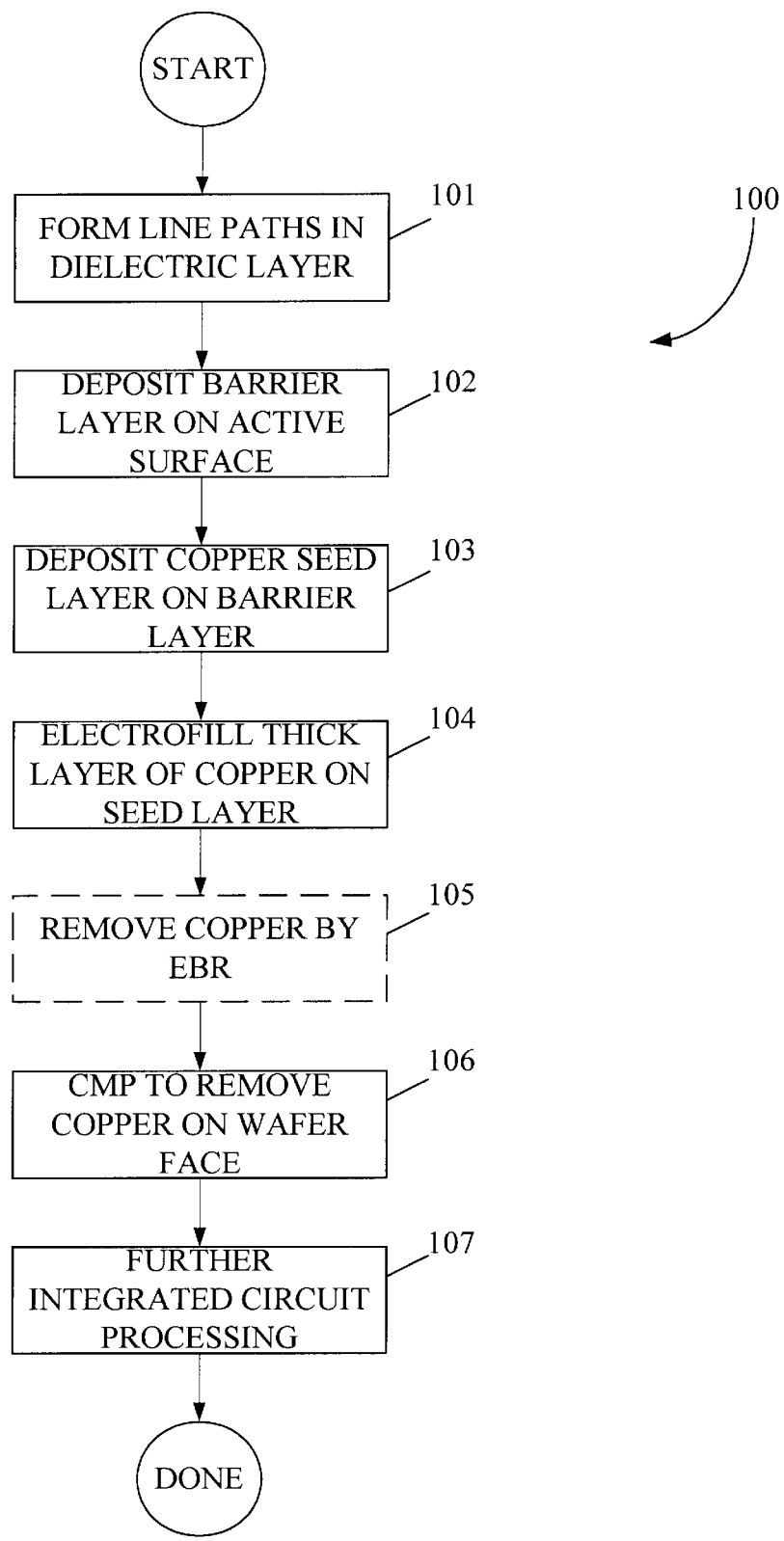
FIG. 1 is a process flow diagram illustrating relevant operations employed to form conductive copper lines by Damascene processing.

A typical Damascene process flow 100 is illustrated in the flowchart of FIG. 1 in order to contextualize the present invention. Process 100 begins with formation of line paths in a previously formed dielectric layer. These line paths may be etched as trenches and vias in a blanket layer of dielectric such as silicon dioxide. The line paths define conductive routes between various devices on a semiconductor wafer. Because copper or other mobile conductive material provides the conductive paths of the semiconductor wafer, the underlying dielectric layers must be protected from metal ions (e.g., $Cu^+1$) that might otherwise diffuse into the silicon. To accomplish this, the process includes depositing a thin diffusion barrier layer 102 before depositing the metal. Suitable materials for the diffusion barrier layer include titanium, tantalum (Ta), tantalum nitride (TaN), tantalum nitride silicon (TaNSi), tungsten (W), titanium (Ti), titanium tungsten (TiW), titanium nitride silicon (TiNSi) and the like. The barrier layer is typically formed by a PVD process such as sputtering.

Before inlaying the line paths with the electrofill copper, a conductive surface coating must be applied. In the depicted process, this is accomplished by depositing a copper seed layer on the barrier layer at 103. This seed layer is deposited by a PVD process of the current invention, as will be discussed in detail below. Typically, the seed layer is deposited to a thickness of between about 300–2000 Å and more preferably between 1000–1500 Å on the planar areas and about 50 Å on the bottoms and sidewalls of vias and trenches. Next, as indicated at 104, a much thicker layer of copper is deposited on the seed layer by electroplating. After deposition of the copper is completed, the copper is planarized, generally by chemical-mechanical polishing (CMP) down to the dielectric at 106 in preparation for further processing (illustrated at 107), generally the addition of subsequent dielectric and metalization layers.

Dual Damascene processing is a subset process of Damascene processing wherein two layers of dielectric are laid down and then etched consecutively. The lower of the two layers is etched to define narrow vertical features such as vias that conductively couple lower and higher metalization layers, the upper of the two dielectric layers is etched to define the trenches in which horizontal metal lines are inlaid. This two-layer process facilitates the interconnecting of metal between two different layers of the integrated circuit.

Figure 2:
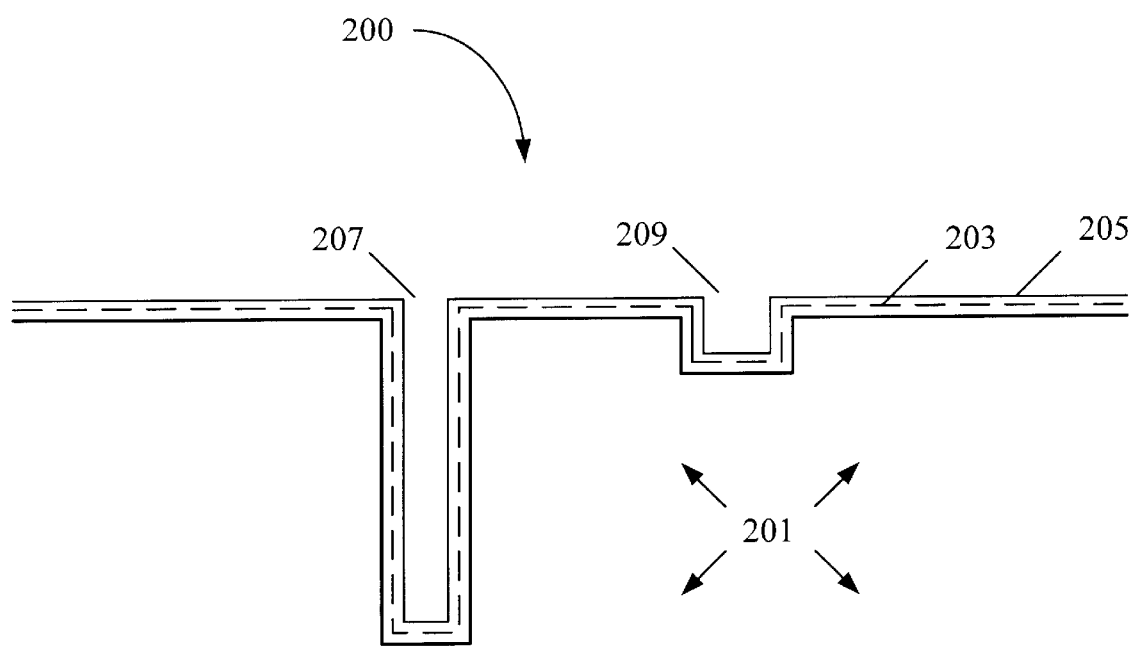
FIG. 2 is a schematic illustration showing a substrate surface with a deposited barrier layer and copper seed layer.

FIG. 2 schematically illustrates a section of an IC substrate 200, including the dielectric 201, barrier layer 203, and the seed layer of copper 205 to be deposited by the present invention. The figure also shows two etched surface features for illustrative purposes, 207 and 209. The substrates may also have previously formed layers of barrier and metal (not shown).

When copper is deposited on a typical barrier surface in IC metalization such as tantalum or tantalum nitride it tends to agglomerate. The behavior of a deposited film of metal or liquid on a surface is determined by the balance of surface forces at the interface. These forces are described by the Young-Dupré equation, which is further described in Zinke-Allmang, M., "Phase separation on solid surface: nucleation, coarsening and coalescence kinetics," *Thin Solid Films* 346 (1999) 1–68. FIG. 3 shows these forces and how they lead to agglomeration of the copper.

Figure 3A:
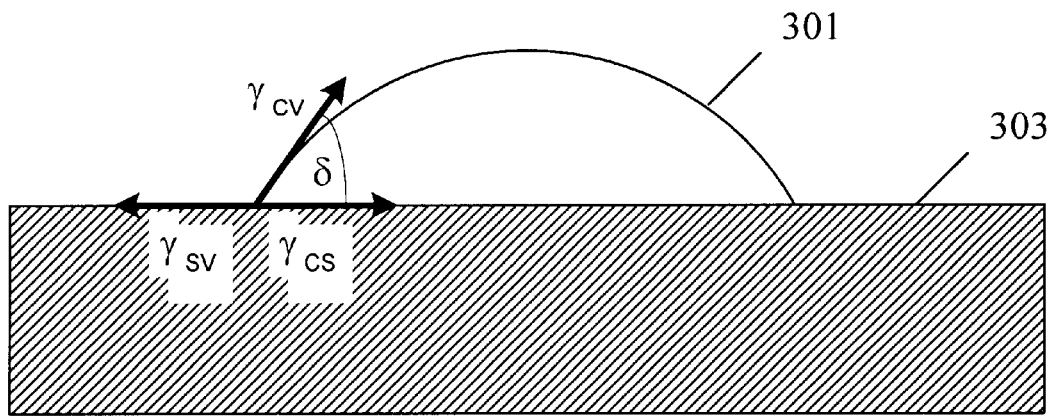
FIG. 3A is a schematic illustration showing a liquid or metal on a surface, and the forces acting on the liquid or metal according to Young-Dupré equation that result in wetting or agglomeration.

FIG. 3A schematically shows a sample vapor-deposited film of metal or liquid 301 on a surface. γCV is the film-vacuum interfacial force vector, γSV is the substrate-vacuum interfacial force vector and γCS is the substrate-film interfacial force vector. An atmosphere may be substituted for the vacuum. The Young-Dupré equation states that $\gamma SV = \gamma CS \gamma CS + \gamma CV \cos\delta$ where δ is shown in FIG. 3A. If γSV is less than the other two forces, that is, if δ is greater than 0°, then the film will agglomerate into droplets. This describes the behavior of copper metal deposited onto a typical barrier surface. By contrast, if γSV is greater than the other two forces, the film will wet into a uniform layer on the surface. If the PVD deposition is carried out properly, the copper will be deposited conformally. But due to the thermodynamics of copper on the substrate surface, as explained, it will agglomerate after deposition.

The Young-Dupré equation describes the thermodynamic behavior of the vapor-deposited metal or liquid on a surface. Just as important are the kinetics. Copper, in its pure elemental form, is extremely mobile at temperatures at which PVD is carried out, and thus achieves the thermodynamically favored state very quickly, i.e., agglomerates very quickly. Though these kinetics are highly dependent on temperature, it is an impractical strategy to cool the PVD process to slow down the copper agglomeration. The energetics of PVD deposition onto the substrate surface are so high that the substrate cannot be kept at a low temperature. When PVD is commenced, the surface immediately heats up to 50° C. or 100° C. or more, even though the substrate is typically cooled to a low temperature, typically about −100° C. or −50° C. before hand.

If either the thermodynamics or kinetics of the copper agglomeration reaction can be altered, then agglomeration may be reduced. The approach of the current invention is mainly to slow the kinetics, though alteration of the thermodynamics to disfavor agglomeration is not ruled out. Copper atoms in $Cu_3N$ (copper nitride) are believed to have a much lower mobility than pure copper, and therefore a deposition layer containing $Cu_3N$ agglomerates far less than copper does. $Cu_3N$ is a good candidate for alternative deposition chemistry because it is also quite unstable, and upon heating it easily converts back to elemental copper while releasing the nitrogen as a gas.

Further, when the amount of nitrogen deposited is small, such that X-ray diffraction plots show no detectable amounts of $Cu_3N$ formed, clear, significant and visible reductions in agglomeration are still achieved. This indicates that copper-nitrogen mixtures, with a small amount of nitrogen trapped in the copper layer, and not just the copper-nitrogen compound, are effective at reducing the mobility of the copper. Since nitrogen and other anti-agglomerations agents are typically somewhat reactive, unlike the neutral gases such as argon that are used for sputtering, it is preferred to keep the amount of anti-agglomeration agent in the PVD apparatus system as low as possible to avoid interfering with the PVD process. Thus the observation that a small amount of nitrogen is effective as an anti-agglomeration agent is therefore noteworthy.

One or more of the following mechanisms may be responsible for this. The nitrogen might be responsible for increasing the defect density in the copper, which could reduce its mobility. It might absorb some of the energy/heat present in the PVD process, and thus reduce the mobility of the copper. X-ray diffraction plots also show that such small amounts of nitrogen change the copper's crystal orientation from (111) to (200). This change in the orientation might also be responsible for reduced mobility of the copper. However, the inventors do not wish to be bound by theory, and have ample experimental observation to confirm the efficacy of practicing the invention with small amounts of nitrogen where no $Cu_3N$ is formed.

When discussing the present invention, it therefore will be useful to use the notation Cu(N), which indicates that all phases of nitrogen are incorporated into copper. The notation indicates that some or all of nitrogen may be incorporated into the copper such as the compound $Cu_3N$, but is not limited to this. Some nitrogen may be present in the copper in a non-covalently or ionically-bonded form, but as discussed, nitrogen incorporated in the copper seed layer as Cu(N) in whatever form is useful for reducing agglomeration. Cu(N) also covers the possible stoichiometry $Cu_4N$, though it is believed that this is a far less common stoichiometry of the compound. In addition, the presence of Cu(N) in the copper seed layer may improve electroplating by increasing the wettability of the surface.

Figure 3B:
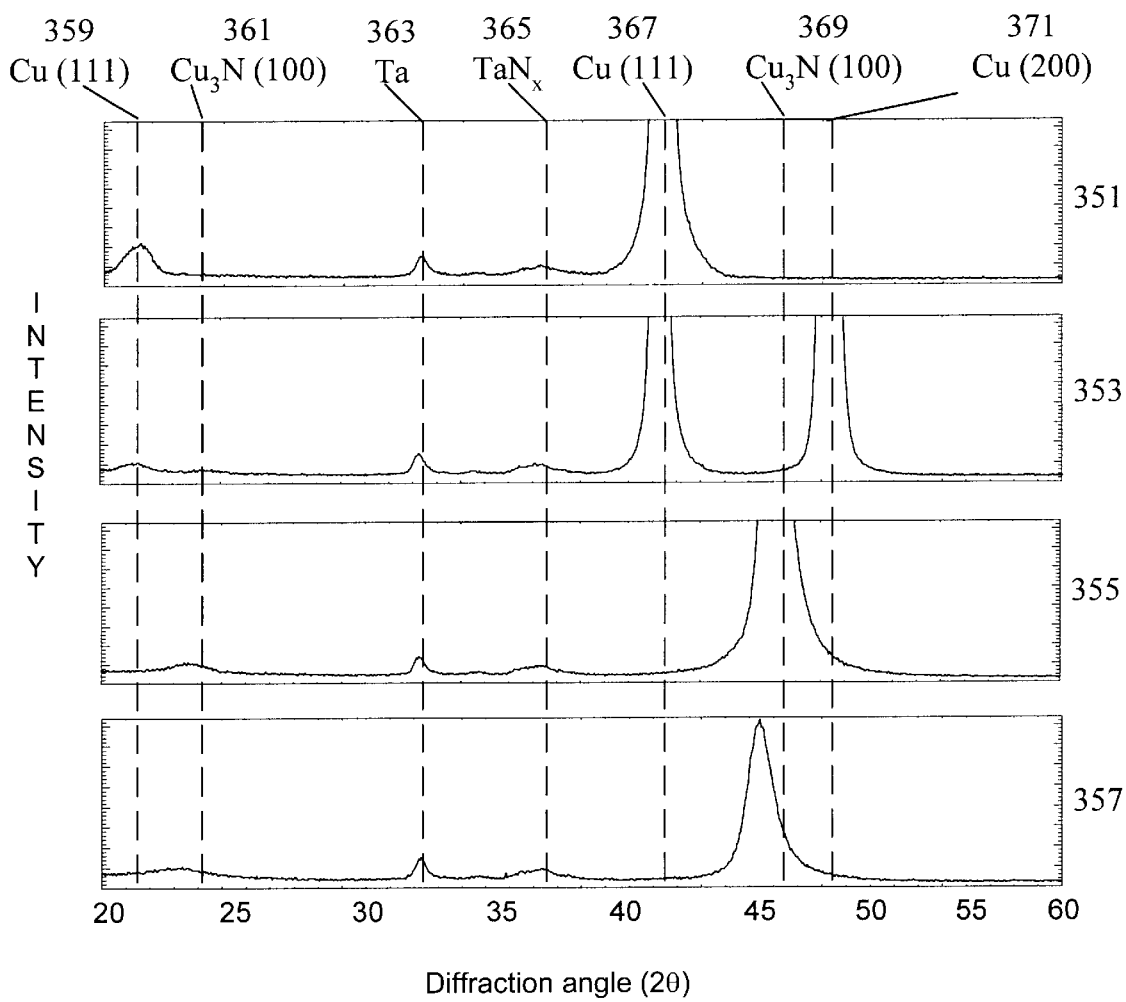
FIG. 3B is a series of X-ray diffraction plots illustrating the phases of Cu and Cu(N) formed at various $N_2$ rate flows.

FIG. 3B is a series of four X-ray diffraction (XRD) plots showing the phases of nitrogen formed at various experimental nitrogen flows. The X-axis of each plot corresponds to the angle of the substrate with respect to the X-ray beam, 0° being parallel to the beam and 90° being normal to the beam. The diffraction angle measured was 2θ. The Y-axis is the relative intensity of diffraction, thus a substantial peak shows that a particular phase of Cu or Cu(N) is present in the sample. In all the XRD plots, the Ar flow was 50 SCCM. The first XRD plot 351 corresponds to an $N_2$ flow of 0 SCCM, the second XRD plot 353 corresponds to 5 SCCM, the third XRD plot 355 corresponds to 25 SCCM and the fourth XRD plot 357 corresponds to 40 SCCM.

The XRD plots are labeled with the peak locations of various phases of copper and copper nitride. While it is believed that the seed layers formed with small amounts of $N_2$ flow form some phase of Cu(N), in the XRD plots they are labeled as Cu because the peak locations correspond to the XRD locations of pure copper. Peaks for Ta and $TaN_x$ are labeled as well. The labeled peaks are Cu (111) 359 and 367, $Cu_3N$ (100) 361 and 369, Ta(002) 363, $TaN_x$ (365) and $Cu_3N$ (200) 371. Plot 351 (0 SCCM) shows only the presence of Cu (111), while plot 353 (5 SCCM) shows both Cu (111) and Cu (200). Thus both show regular crystal orientation of the copper influenced by the small amounts of nitrogen present. Plots 355 (25 SCCM) and 357 (40 SCCM) shows only the presence of $Cu_3N$ (200).

Figure 4A:
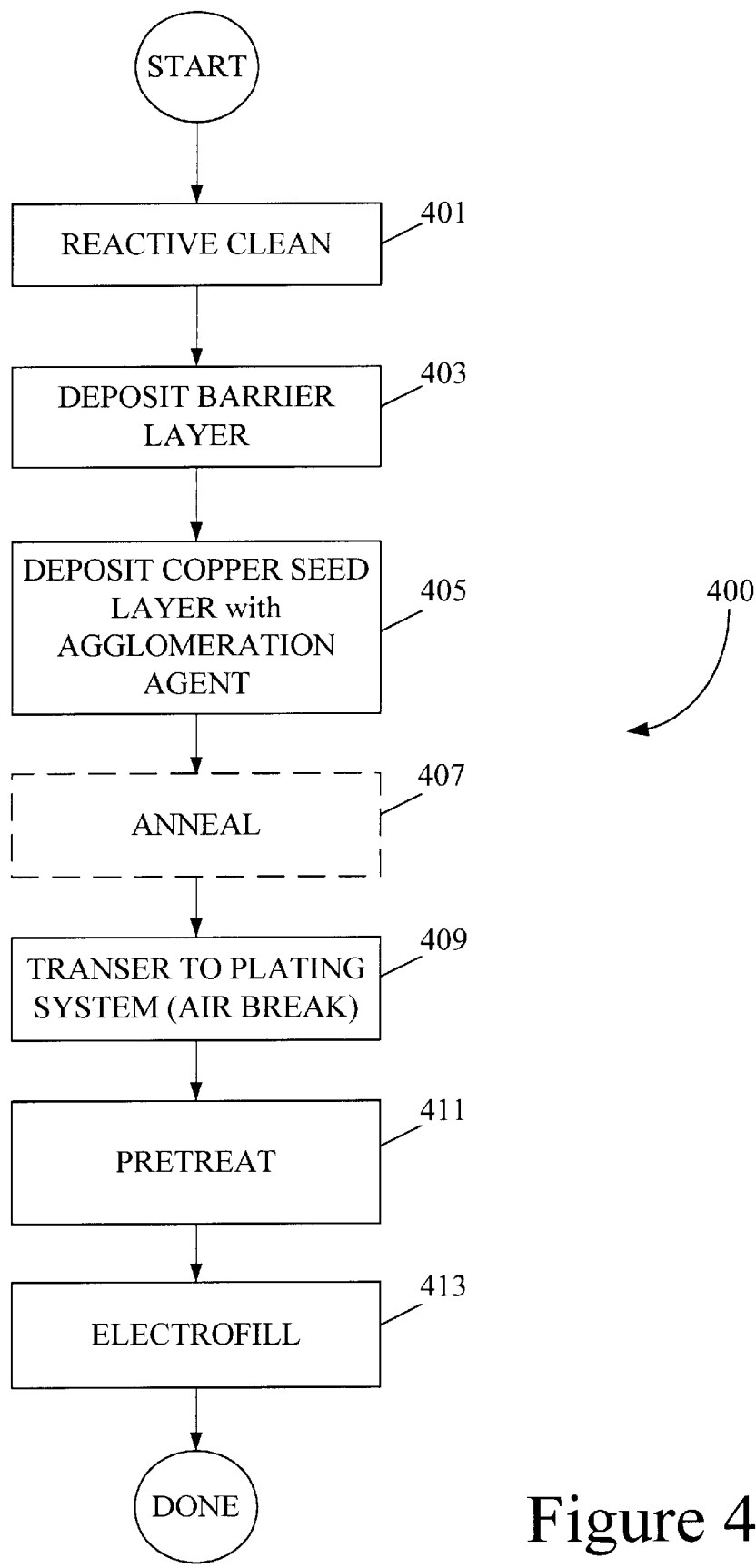
FIG. 4A is a process flow diagram illustrating relevant operations employed to deposit copper by PVD according to the present invention.

A high-level description of a process 400 of the present invention is illustrated in the flowchart of FIG. 4A. Blocks 401 through 411 represent operations that may be subsumed within the general seed layer deposition operation 103 shown in FIG. 1. While this description is discussed in the context of a dual Damascene process, it is not limited to just this type of IC processing.

The invention is typically carried out on a dielectric substrate, as a sub-process in forming the first layer of metalization on the substrate, or a later metalization layer. In either case, the substrate will already have surface features such as vias and channels etched into the dielectric. In the latter case, the substrate will also include areas of electrofilled copper from the completed lower layers.

In either case, a cleaning operation is carried out to remove any unwanted materials, such as copper oxide, from the underlying electrofilled copper or conductive surface (e.g., polysilicon or metal silicide). See 401. This precleaning is typically done by a physical sputter etch of neutral gas plasma to remove the unwanted materials, and/or by a reactive cleaning which involves the use of an hydrogen-based plasma to reduce copper oxide back to copper. The precleaning also typically involves degassing, which also helps to remove unwanted materials.

Next, the barrier layer is deposited. See 403. The barrier layer is typically about 300 Å of a barrier material, such as tantalum, which is deposited by a PVD process such as hollow-cathode magnetron (HCM) PVD. The copper seed layer is then deposited by the process of the current invention. See 405. In a specific embodiment, the copper is deposited by an HCM PVD sputtering process. A preferred apparatus for carrying out this deposition is described in FIG. 5 below. An argon plasma provides argon ions that strike the copper target, which sputters copper atoms out into the chamber and onto the substrate surface, among other areas. In a preferred embodiment, the copper target is bombarded for about 10 to 60 seconds with an argon plasma produced from a flow of about 50 standard cubic centimeters per minute (SCCM) of argon. This results in a deposition of approximately 250–2500 Å of copper. In various embodiments, about 5–100 SCCM of argon plasma is used for about 20 to 100 seconds. More preferably, between about 20 and 50 SCCM of argon plasma is used for between about 20 and 40 seconds. The power used to generate the plasma is about 20 kW to 50 kW, more preferably about 36 kW.

HCM PVD uses a hollow metal cathode (target) rather than the flat target that is used in most PVD methods and a DC magnet coil instead of an RF magnet coil. In some cases, HCM PVD is preferable to other PVD methods because is achieves up to about 90% ionization of the copper atoms, rather than the mere 2% that is typical of other methods. Because of this ionization ratio, among other reasons, HCM provides more conformal coverage of the substrate surface. One example of an apparatus suitable for HCM PVD is the INOVA, available from Novellus Systems of San Jose, Calif.

Figure 4B:
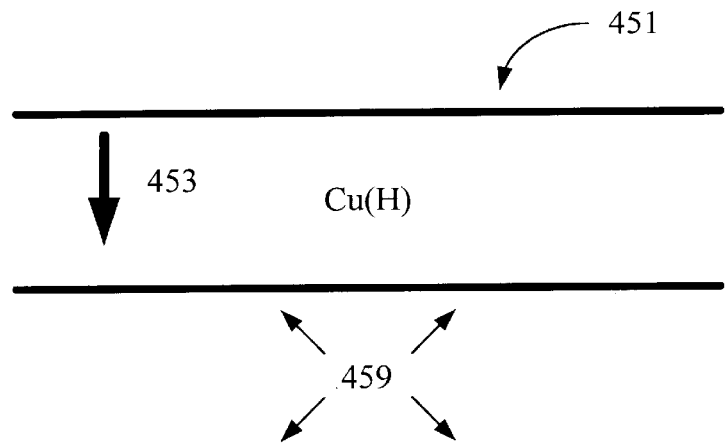
FIG. 4B is a schematic illustration of a copper seed layer with the anti-agglomeration agent formed into a single Cu(N) layer and two layers, with Cu(N) at the substrate interface and pure copper above.

In a preferred embodiment, the nitrogen is incorporated into the copper seed layer by implementing a nitrogen source such as molecular nitrogen gas or nitrogen plasma gas concurrently with the copper PVD deposition. This assures that the nitrogen is immediately present to prevent copper agglomeration. The nitrogen can be used during some or all of the PVD deposition; if only during some of the deposition, then preferably during the first part of the deposition, since the presence of nitrogen at the substrate-copper interface is most important to prevent agglomeration. These preferred embodiments are illustrated in FIG. 4B, which shows a copper seed layer 451 formed by application of nitrogen throughout the PVD process and thus is entirely Cu(N). FIG. 4B also shows a copper seed layer 453 with a Cu(N) layer 455 formed at the substrate interface and a pure layer of Cu 457 on top of the Cu(N). The Cu(N) layers as described in FIG. 4B may or may not include detectable amount of $Cu_3N$, and can even in some embodiments be pure $Cu_3N$. The substrate 459 is illustrated underneath the copper seed layers.

However, application of the nitrogen after deposition of the copper is not ruled out as an embodiment. If practiced in this manner, the nitrogen is preferably applied in situ, immediately after deposition of the copper, or else agglomeration is likely to take place. This embodiment may also involve partial deposition of the copper, followed by nitrogen application and then completion of the copper layer.

As stated above, in various embodiments, for the PVD operation about 5–100 SCCM of argon is used for about 20 to 100 seconds. More preferably, between about 20 and 50 SCCM of argon plasma is used for between about 20 and 40 seconds. For the nitrogen, about 1–50 SCCM and more preferably about 1–35 SCCM is used. If, for example, 50 SCCM of argon is being used for the PVD, then about 1–5 SCCM of nitrogen will result in no detectable amount of $Cu_3N$ being formed for the duration of the nitrogen exposure, but agglomeration will still be reduced. If the amount of nitrogen is 5 SCCM or more, then an increasingly large amount of $Cu_3N$ will be formed up to 25 SCCM where the only detectable phase formed was $Cu_3N$. In one preferred embodiment, the nitrogen is used only for a portion of the PVD deposition, preferably the first 10 seconds of a 40 second PVD operation. FIG. 3B, as discussed earlier, shows experimental evidence for the formation or non-formation of the actual compound $Cu_3N$.

In the processes of this invention, an active annealing operation is not required, but may be carried out at 407. Annealing is generically any operation performed at desired temperatures and atmosphere in order to facilitate processing, for example, to promote adhesion of the seed layer to the barrier layer, or to drive nitrogen out from the copper seed layer prior to electrofill. However, it has been found that an annealing operation is not preferable in practicing the current invention, possibly because a better electrofill occurs when some Cu(N) is present in the seed layer due to improved wetting.

The next operations in the flowchart, 409, 411 and 413, essentially correspond to the Damascene electrofill operation 104 described above. The IC wafer, with its deposited seed layer, is transferred to a plating system, 409, to fill in a thicker layer of copper to complete the conductive routes. This operation typically involves an air break; that is, the IC wafer is exposed to air while it is being transferred to the plating system. This operation may also involve some storage time before the wafer is placed in the plating system, which also typically involves exposure to air.

The IC wafer optionally can be pretreated, 411, if necessary, before the plating operation 413. The pretreatment operation could involve an anneal much like that described in 407 to drive nitrogen from the copper, but has been found not preferable for the same reasons described in 407.

The pretreat operation 411 could also involve reduction of copper oxide back to copper, due to the air break. However, it has been found that a small amount of copper oxide, about 40 Å, is most desirable as a starting point for the plating operation 413. Either more or less copper oxide results in less optimal plating. If some oxidation of the copper is necessary, this oxidation is typically carried out by an oxygen plasma, which oxidizes the copper in a rapid and controllable manner. If too much copper oxide has been developed, some of this could be reduced back to copper with a reducing plasma such as hydrogen. However, this is somewhat problematic as this would leave a layer of pure copper on top of the desired 40 Å copper oxide layer that is desirable for electrofill. Another option is to reduce all of the copper oxide and then reform 40 Å of copper oxide, but this would be time-consuming. Therefore, it is generally preferred to arrange the operations for FIG. 4A so that 40 Å or slightly less is formed during the air break. After electrofill 413, the copper metal is then planarized in preparation for further IC processing, such as additional layers of metalization as described in FIG. 1.

Thickness of the copper oxide during pretreatment 411 can be measured by reflectance of the surface at 440 nm. This is described in more detail in U.S. patent application Ser. No. 09/776,704, "Passivation of Copper in Dual Damascene Metalization" A detailed description of methods and systems for depositing copper seed layers and passivating the copper to prevent oxidation (during, for example, the air break as described above) also can be found in that application. The methods and systems of that invention are compatible with those described in this patent application, and can typically be practiced simultaneously with this invention.

Figure 5:
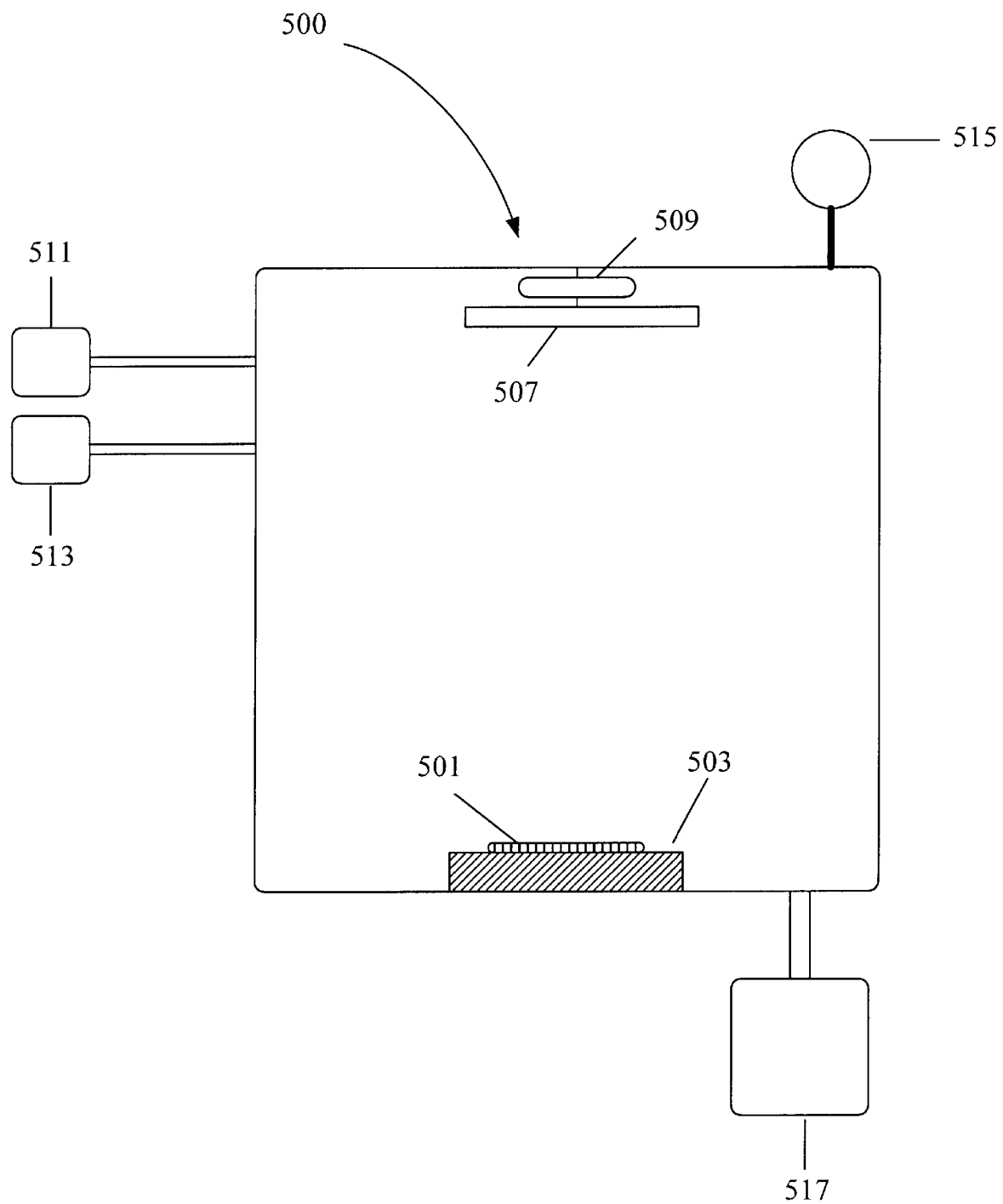
FIG. 5 is a schematic illustration showing a apparatus PVD chamber suitable for practicing the present invention.

FIG. 5 depicts a PVD system 500, in which the invention may be practiced. Inside the apparatus chamber, the semi-conductor wafer 501, sits on top of a supporting pedestal 503. The supporting pedestal 503 has a thermocouple or other temperature sensing mechanism attached to it to precisely monitor the temperature of the wafer. The wafer can be cooled by any number of commonly-known methods. In a preferred embodiment, the wafer is placed on a table that is maintained at a cool temperature, and is also exposed on its bottom-side to a cool neutral gas such as Ar at 7 torr.

The apparatus includes a copper target 507 and magnets for directing the copper ions 509. FIG. 5 shows both an argon source 511 and a passivating agent source 513. If both sources 511 and 513 are being used, they can be introduced through different lines as shown, or through the same line. The flow rate from each of these sources can be controlled separately. If introduced as gas, they must be converted to plasma within system 500. The system also includes a pressure gauge 515 and a pump 517 for controlling the flow of gases. A plating system that can be used with the invention is the SABRE plating system, available from Novellus Systems of San Jose, Calif.

In general, an anti-agglomeration agent reduces the rate of the agglomeration reaction and may also diminish the thermodynamic propensity to agglomerate. As indicated above, nitrogen is a suitable anti-agglomeration agent. Other anti-agents include any other substance that bonds with copper in a manner that reduces its mobility, including metallic elements such as silicon or platinum. With any of these types of agents, the likely mechanism for reduction of agglomeration is the formation of some phase of compound (e.g., Cu(N), Cu(Si), Cu(Pt)) which reduces the mobility of the copper, though thermodynamics may be involved as well. Preferably, the agent is easy to remove from the copper seed layer after deposition.

Although various details have been omitted for clarity's sake, various design alternatives may be implemented. Therefore, the present examples are to be considered as illustrative and not restrictive, and the invention is not to be limited to the details given herein, but may be modified within the scope of the appended claims.

What is claimed is:

1. A method of physical vapor deposition of copper to form part or all of a seed layer on an integrated circuit substrate surface, the method comprising:

physical vapor deposition of copper onto the substrate surface to form the copper seed layer; and applying an anti-agglomeration agent to incorporate the agent into the seed layer so that agglomeration of the seed layer is reduced.

2. The method of claim 1 wherein the anti-agglomeration agent is a metallic element.

3. The method of claim 1 wherein the anti-agglomeration agent is silicon or platinum.

4. The method of claim 1 wherein the copper is deposited by hollow-cathode magnetron physical vapor deposition.

5. The method of claim 1 wherein the anti-agglomeration agent is contained in a gas or plasma.

6. The method of claim 1 wherein the incorporating is simultaneous with physical vapor deposition of the copper seed layer.

7. The method of claim 1 wherein no separate annealing of the copper seed layer operation is carried out.

8. The method of claim 1 wherein the integrated circuit surface includes an etched dielectric layer used in Damascene processing.

9. The method of claim 1 wherein the etched dielectric layer comprises two separate dielectric layers used in dual Damascene processing.

10. The method of claim 1 wherein the anti-agglomeration agent reduces mobility of the copper in the copper seed layer.

* * * * *